United States Patent [19]

King et al.

[11] Patent Number: 4,704,449

[45] Date of Patent: Nov. 3, 1987

[54] POLY(IMINOMETHYLENE) COPOLYMER FROM ISOCYANIDES

[76] Inventors: Robert B. King, 185 Holly Falls Dr., Athens, Ga. 30606; Lester Borodinsky, 18357 Lost Knife Cir., No. 303, Gaithersburg, Md. 20879

[21] Appl. No.: 781,495

[22] Filed: Sep. 30, 1985

Related U.S. Application Data

[63] Continuation-in-part of Ser. No. 666,902, Oct. 31, 1984, Pat. No. 4,609,716.

[51] Int. Cl.$^4$ .............................................. C08G 83/00
[52] U.S. Cl. .................................... 528/392; 528/422; 558/302
[58] Field of Search ................................. 528/392, 422

[56] References Cited

U.S. PATENT DOCUMENTS 3,200,087 8/1965 Robinson et al. ................... 526/310
3,423,333 1/1969 Stackman et al. .................. 528/422
4,062,787 12/1977 Jolivet et al. ....................... 526/310
4,609,716 10/1984 King et al. ........................... 524/600

FOREIGN PATENT DOCUMENTS 1575868 6/1969 France .

OTHER PUBLICATIONS

Proc. IUPAC, Macromol. Symp., 28th, 1982, p. 451.
Kogyo Kagaku Zasshi, vol. 70, 10 (1967), pp. 1822–1825.
Nippon Kagaku Zasshi, vol. 89, 9, (1968), pp. 78–80.
CA 70:47921(m); "Polymerization of Isocyanides II. Cationic Copolymerization of Isocyanides" and Nippon Kagaku Zasshi, vol. 89, 9 (1968) and English language version corresponding thereto. Yamamoto et al.
CA 68:10558(v): "Copolymerization of Isonitriles by Boron Trifluoride Ethyl Etherate," by S. Iwatsuki et al. and Kogyo Kagaku Zasshi, vol. 70, 10 (1967) pp. 1822–1825 and English Language version thereof.
CA 99:195702(e): "Poly(Iminomethylenes) Charge Transfer Interactions by Oostveen, F. A. et al.

Primary Examiner—Harold D. Anderson
Attorney, Agent, or Firm—Curtis, Morris & Safford

[57] ABSTRACT

A poly(vinyliminomethylene) polymer having at least one recurring structural unit of the formula:

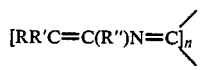

wherein R and R', which are the same or different, are each hydrogen, a $C_1$-$C_8$ alkyl group or $C_3$-$C_7$ cycloalkyl group which alkyl or cycloalkyl groups are unsubstituted or substituted by lower alkyl or alkoxy groups or which contain up to four non-catenated oxygen atoms, a $C_2$-$C_8$ alkenyl group or a $C_5$-$C_7$ cycloalkenyl group which is unsubstituted or substituted by lower alkyl or alkoxy groups, a phenyl group or naphthyl group which is unsubstituted or substituted by lower alkyl or alkoxy groups, with the proviso that at least one of R and R' be a substituent other than hydrogen; R" is hydrogen; and n has a value such that the weight-average molecular weight is in the range of about 2,000 to 400,000 as determined by gel permeation chromatography.

13 Claims, 1 Drawing Figure

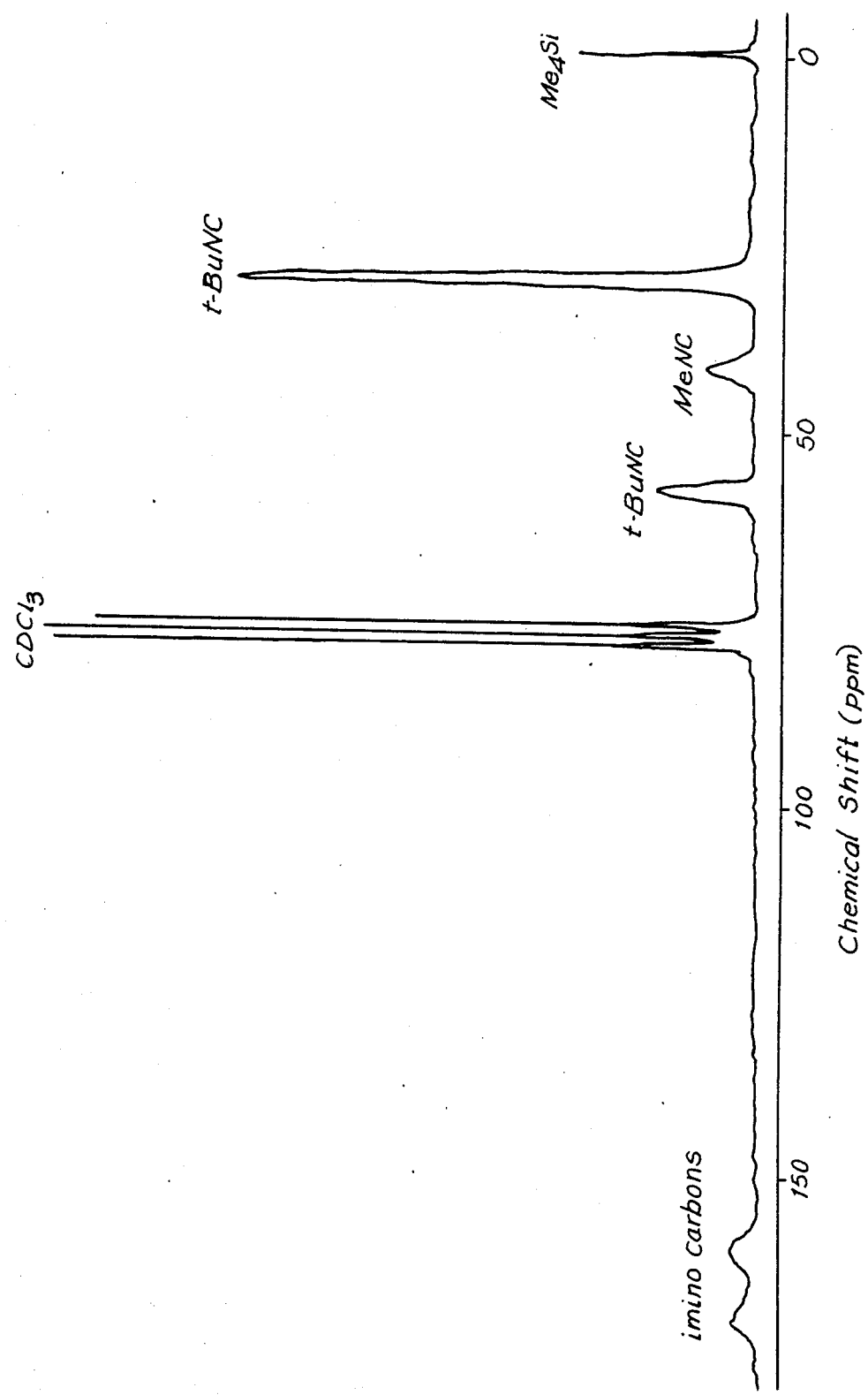

POLY(IMINOMETHYLENE) COPOLYMER FROM ISOCYANIDES

This application is a continuation-in-part of application Ser. No. 666,902 filed on Oct. 31, 1984, now U.S. Pat. No. 4,609,716.

BACKGROUND OF THE INVENTION

1. Field of the Invention

The present invention relates to poly(iminomethylene)polymers, particularly copolymers thereof. This invention also relates to vinyl isocyanide compounds for the preparation thereof.

2. Description of the Prior Art

The homopolymerization of isocyanides, RNC, yields a rather unusual class of polymers, namely the poly(iminomethylenes), having the formula

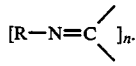

These polymers are of interest as their viscosity behavior, Debye-Scherrer X-ray composites, and optical rotation data suggest that the polymers have a rigid rod helical structure. The same structure appears to be consistent with observations from molecular models. F. Millich, *Adv. Polym. Sci.*, 19, 117 (1975) and *Chem. Rev.*, 72, 101 (1972). With the recognition that a helical structure is the most likely structure, subsequent experimentation soon indicated that various isocyanide oligomers could be resolved into fractions having (+) and (−) signs of optical rotation. R. J. M. Nolte et al, *J. Am. Chem. Soc.* 96, 5932 (1974). Hence, the poly(iminomethylenes) appear to have a chiral helical rigid rod structure.

The chirality of these polymers renders them of interest and useful as chiral supports for asymmetrical catalysts. Moreover, these polymers have a backbone of carbon atoms each having a nitrogen atom bonded directly thereto by means of a double bond which renders them of interest as building blocks for novel conducting polymeric materials.

The first characterized high polymer of an isocyanide, RNC, and a catalytic synthetic procedure were reported in 1965. However, although some polyisocyanide studies have been conducted, as described above, more extensive investigations of the synthesis and properties of these polymers have been hampered by the extreme insolubility of most of the poly(iminomethylenes). Moreover, the polymer insolubilities have largely prevented investigations pertaining to the possible uses for these polymers. With the combination of chirality and rigidity, the poly(iminomethylenes) should offer a wide range of uses such as selective supports in chromatography, as enantioselective catalysts, and as specific reagents with respect to substrates of biochemical importance. Unfortunately, the realization of these possiblities has been frustrated due to the pervasive insolubility of the poly(iminomethylenes).

For example, among the poly(iminomethylenes) derived from simple isocyanides, those prepared from phenethyl and tert-butyl isocyanides have been found to be soluble in chloroform, whereas those prepared from methyl, ethyl, n-butyl, isopropyl, cyclohexyl and phenyl isocyanides are insoluble in chloroform. *Rec. Trav. Chim. Pays-Bas.*, 1973, 92, 83, R. J. M. Nolte et al. Similarly, among the polymers obtained from the homopolymerization of vinyl isocyanides, those prepared from $(CH_3)_3CCH=CHNC$, $C_6H_5CH=CHNC$ and $C_6H_5C(CH_3)=CHNC$ are soluble in chloroform, whereas those prepared from $CH_3CH=CHNC$, $(CH_3)_2C=CHNC$, $2,4,6-(CH_3)_3C_6H_2CH=CHNC$, and $CH_3CH=C(CH_3)CH=CHNC$ are insoluble in chloroform.

Thus, the limited number of isocyanides that polymerize to soluble poly(iminoethylenes) severely limits the range of pendant groups that can be attached to a soluble poly(iminomethylene) backbone through the homopolymerization of isocyanides.

Hence, a need continues to exist for a poly(iminomethylene) type polymer which is soluble and which would, therefore, facilitate the study and use of these polymers.

SUMMARY OF THE INVENTION

Accordingly, it is an object of the present invention to provide poly(iminoethylene)polymers which have excellent solubility.

It is also an object of this invention to provide poly(iminomethylene)polymers which have, by virtue of their molecular structure, a variety of pendant groups.

In particular, it is an object of the present invention to provide poly(iminomethylene)copolymers of which at least one comonomer thereof is a vinyl isocyanide.

It is also an object of this invention to provide vinyl isocyanide monomers to be used in the preparation of the present polymers.

According to the present invention, the foregoing and other objects are attained by providing a poly(iminomethylene)polymer having at least one recurring structural unit of the formula:

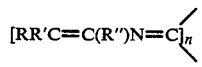

wherein R and R', which are the same or different, are each hydrogen, a $C_1-C_8$ alkyl group or $C_3-C_7$ cycloalkyl group which alkyl or cycloalkyl groups are unsubstituted or substituted by lower alkyl or alkoxy groups or which contain up to four non-catenated oxygen atoms, a $C_2-C_8$ alkenyl group or a $C_5-C_7$ cycloalkenyl group which is unsubstituted or substituted by lower alkyl or alkoxy groups, a phenyl group or naphthyl group which is unsubstituted or substituted by lower alkyl or alkoxy groups, with the proviso that at least one of R and R' be a substituent other than hydrogen; R" is hydrogen; and n has a value such that the weight-average molecular weight (Mw) is in the range of about 2,000 to 400,000 as determined by gel permeation chromatography.

BRIEF DESCRIPTION OF THE DRAWING

FIG. 1 is a carbon-13 NMR spectrum of a copolymer, in accordance with the present invention, obtained from equimolar amounts of methyl isocyanide and tert-butyl isocyanide.

DETAILED DESCRIPTION OF THE PREFERRED EMBODIMENTS

According to one aspect of the present invention it has been found that vinyl isocyanides, RR'C=C(R")NC, can be homopolymerized with nickel (II) catalysts to give the corresponding poly(vinyliminomethylenes). By an appropriate choice of the vinyl isocyanide monomer, the corresponding poly(vinyliminomethylene) is obtained as a yellow to brown solid which is soluble in chloroform. The polymers can be purified by dissolution in chloroform and reprecipitation with ethanol.

Available infrared (IR) data as well as proton and carbon-13 nuclear magnetic resonance (NMR) data for the poly(vinyliminomethylenes) indicate that the polymerization of the vinyl isocyanide occurs through the isocyanide functionality rather than through the carbon-carbon double bond. Therefore, the poly(vinyliminomethylenes) of the present invention have the structural formula:

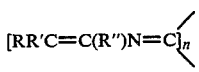

with pendant carbon-carbon double bonds. This type of structure is extremely advantageous for use in the following applications:

(1) Formation of highly conjugated conducting materials arising from the pendant carbon-carbon double bonds.

(2) Photocrosslinking of soluble poly(vinyliminomethylenes) through the photo-initiated free radical addition reactions of the pendant carbon-carbon double bonds to give insoluble cross-linked materials. Moreover, as the cross-linked materials would, most likely, be conducting, such materials would be very useful in the manufacture of printed circuits.

(3) The use of the pendant carbon-carbon double bonds as a site for anchoring transition metal functionalities of catalytic interest. This would be a new example of the known non-classical bonding interaction of the $\pi$ electrons of unsaturated moieties with transition metal orbitals. This would be expected to generate novel polymer-supported catalysts. Indeed, such catalysts could be useful for asymmetric synthesis, if the poly(vinyliminomethylene) were resolved into the pure enantiomers, i.e., the right and left-handed helices.

(4) The carbon-carbon double bonds would provide sites for further chemical reaction such as, cross-linking or addition reactions.

The poly(vinyliminomethylene)homopolymers of the present invention have the structural formula:

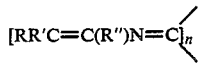

wherein R and R', which are the same or different, may be hydrogen or an alkyl or alkenyl group of practically any size. However, it is preferable that the alkyl group be a $C_1$–$C_8$ group, which may either be a straight chain or branched-chain alkyl group, or a $C_3$–$C_7$ cycloalkyl group which alkyl or cycloalkyl groups are unsubstituted or substituted by lower alkyl or alkoxy groups or which contain up to four non-catenated oxygen atoms. It is preferable that the alkenyl group be a $C_2$–$C_8$ group, which may either be a straight chain or branched-chain alkenyl group, or a $C_5$–$C_7$ cycloalkenyl group which is unsubstituted or substituted by lower alkyl or alkoxy groups. R and R' may also be an aryl group such as phenyl or naphthyl, both of which may be unsubstituted or substituted by lower alkyl or alkoxy groups. By lower alkyl, herein and below is meant $C_1$–$C_4$ alkyl radicals such as methyl, ethyl, n-propyl, isopropyl, n-butyl, sec-butyl and tert-butyl. By lower alkoxy is meant $C_1$–$C_4$ alkoxy radicals such as methoxy, ethoxy, n-propoxy, isopropoxy, n-butoxy, sec-butoxy and tert-butoxy.

By the expression "non-catenated oxygen atoms" is meant oxygen atoms which are not directly linked to each other but which are, rather, interspersed throughout the carbon chain.

However, in addition to the above definitions of R and R', it is also necessary that at least one of R or R' be a substituent other than hydrogen.

R" is hydrogen and n has a value such that the polymer weight-average molecular weight is in the range of about 2,000 to 400,000 as determined by gel permeation chromatography. However, it is preferable that n have a value such that the polymer molecular weight is in the range of about 10,000 to 80,000. Moreover, the polymers generally have a polydispersivity (Mw/Mn) in the range of 1.7–2.4. However, polydispersivities as high as 3.9 have been observed.

For the above-described homopolymer, it is more preferable yet that R and R' be a $C_1$–$C_8$ straight chain or branched chain alkyl group or a $C_3$–$C_7$ cycloalkyl group which alkyl or cycloalkyl groups are unsubstituted or substituted by lower alkyl or alkoxy groups or which contain up to four non-catenated oxygen atoms. Of the alkyl substituents, the most preferred groups are methyl, ethyl, n-propyl, isopropyl, n-butyl, sec-butyl or tert-butyl. For the cycloalkyl substituents, cyclopropyl, cyclobutyl, cyclopentyl, cyclohexyl and cycloheptyl may be used, and for the cycloalkenyl substituents, cyclopentenyl, cyclohexenyl and cycloheptenyl may be used.

However, larger alkyl, alkenyl, cycloalkyl and cycloalkenyl groups such as those in the range of 8 to 12 carbon atoms are specifically contemplated as being equivalent to the described groups of the present invention.

As indicated R and R' may also be an aryl group such as phenyl or naphthyl, both of which may be unsubstituted or substituted by lower alkyl or alkoxy groups. However, particularly preferred is an unsubstituted phenyl group.

The poly(vinyliminomethylene)homopolymers of the present invention are prepared by the polymerization of a vinyl isocyanide compound. The vinyl isocyanide compound starting material can be prepared according to the method of Schollköpf, *Ann.*, 1977, 1167 as described below according to the following equations:

(1a)

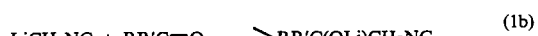

(1b)

(1c)

(TS = tosyl = p-toluenesulfonyl)

-continued $$RR'C(OTs)CH_2NC + KOH \longrightarrow \quad (1d)$$
$$RR'C=CHNC + H_2O + KOTs$$

The present inventors have found that this method works particularly well when the carbonyl compound of (1b) is an aldehyde and not a ketone. By using aldehyde carbonyls in this method, competitive elimination reactions appear to be largely avoided. By contrast, such competitive elimination reactions are often a problem when ketones are used.

The preparation of the vinyl isocyanide compounds by this method will now be further illustrated by certain examples and references which are provided for purposes of illustration only and are not intended to limit the present invention.

EXAMPLE 1

Preparation of $C_6H_5CH=CH-NC$

Amounts used:
9.21 g $CH_3NC$ (0.224 mol) in 275 ml dry THF
140 ml of 1.6N n-BuLi (in hexane) (0.224 mol)
24.4 g benzaldehyde (0.230 mol) in 100 ml dry THF The n-BuLi, benzaldehyde/THF, tosyl chloride/THF are flushed with $N_2$ and placed in the freezer to store until needed. All operations in the following procedure were conducted under $N_2$.

$CH_3NC$ is placed in a 2 l-3 neck flask, which is fitted with a stirrer, a dropping funnel, and an immersed low-temperature thermometer, with THF. This mixture is cooled to $-78°$ C. and the n-BuLi is added at a rate such that the temperature never rises above $-70°$ C. Then the benzaldehyde/THF mixture is added at a rate such that the temperature never rises above $-70°$ C. Stirring is continued for about 10 minutes more, and the tosyl chloride/THF is dropped in such that the temperature never rises above $-65°$ C. Stirring is continued for an additional 15 minutes and the reaction mixture is allowed to warm to $30°-35°$ C.

At this temperature is added the $KOH/CH_3OH$ solution over a period of about 40 minutes. Stirring is continued for an additional 20 minutes after addition is complete. The mixture is then pumped through a dry-ice trap to remove most of the solvents.

The reaction vessel is then flushed with $N_2$ and opened to the air. About 500 ml of $H_2O$ is added, and then about 500 ml of $Et_2O$ (diethyl ether). The aqueous layer is washed with about 300 ml of $Et_2O$. The $Et_2O$ layers are combined and dried over $MgSO_4$ at about $-20°$ C. for about 1½ hrs. This mixture is then filtered, the $MgSO_4$ is washed with $Et_2O$ and then the solvent is pumped through a $-78°$ C. trap.

The remaining liquid is vacuum distilled.

Yield=7.031 g (54.4 mmol) 24.7% of the phenyl vinyl isocyanide.

EXAMPLE 2

Example 1 was repeated except that pivalaldehyde $(CH_3)_3CCHO$ was used as the carbonyl compound in equation (1b) instead of benzaldehyde. A yield of about 75% of the corresponding vinyl isocyanide $(CH_3)_3CCH=CHNC$ was obtained.

EXAMPLE 3

Example 1 was repeated except that 2,4,6-trimethylbenzaldehyde$(2,4,6-(CH_3)_3C_6H_2CHO)$ was used as the carbonyl compound in equation (1b) instead of benzaldehyde. A yield of about 41% of the corresponding vinyl isocyanide $(2,4,6-(CH_3)_3C_6H_2CH=CHNC)$ was obtained as a solid which was purified by recrystallization and vacuum sublimation.

EXAMPLE 4

Example 1 was repeated except that 2-methyl-2-buten-1-aldehyde(tiglaldehyde)$(C_3=C(CH_3)CHO)$ was used as the carbonyl compound in equation (1b) instead of benzaldehyde. A yield of about 57% of the corresponding vinyl compound $(CH_3CH=C(CH_3)CH=CHNC)$ was obtained.

EXAMPLE 5

Example 1 was repeated except that phenyl methyl ketone $(C_6H_5COCH_3)$ was used as the carbonyl compound in equation (1b) instead of benzaldehyde. A yield of about 38% of the corresponding vinyl compound $(C_6H_5C(CH_3)=CHNC)$ was obtained.

It is also possible to produce vinyl isocyanide starting materials according to the method of Saegusa et al (*Tetrahedron*, 1971, 27, 3795) which is particularly useful for preparing vinyl isocyanides of the formula:

$$R_a-\underset{\underset{R_b}{|}}{C}=CH-NC$$

wherein $R_a$ and $R_b$, which may be the same or different, are each hydrogen; alkyl of about 1 to 8 carbon atoms, which may be straight or branched chain; unsubstituted phenyl or phenyl substituted by lower alkyl or alkoxy; and unsubstituted naphthyl or naphthyl substituted by lower alkyl or alkoxy.

The vinyl isocyanide preparation according to the method of Saegusa et al entails (1) the preparation of an allyl formamide from an allyl amine, (2) the preparation of the allyl isocyanide from the allyl formamide and (3) the preparation, by isomerization, of the vinyl isocyanide from the allyl isocyanide, in accordance with the following equations:

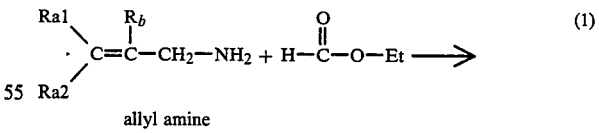

allyl amine

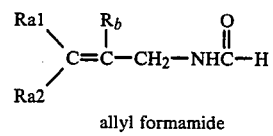

allyl formamide

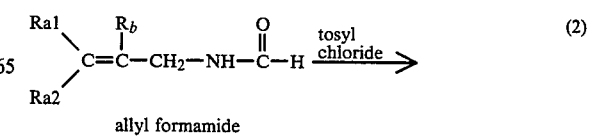

allyl formamide

-continued

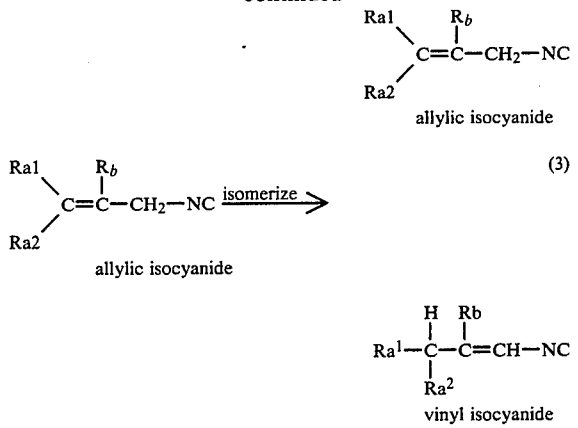

According to the above method, in general, the allyl amine is refluxed with ethyl formate, to form the allyl formamide. Then, the allyl formamide is allowed to react with tosyl chloride (as defined above) in the presence of a base, such as quinoline, to yield the allylic isocyanide upon elimination. Finally, the allylic isocyanide is isomerized to the corresponding vinyl isocyanide in the presence of a cuprous catalyst, such as cuprous oxide.

In the above equations (1), (2) and (3), $R_{a1}$ and $R_{a2}$ may be the same or different and are each hydrogen; an alkyl group of about 1 to 8 carbon atoms, which may be a straight or branched chain; an unsubstituted phenyl group or phenyl substituted by a lower alkyl or alkoxy of about 1 to 4 carbon atoms; $R_b$ is a straight chain or branched chain alkyl group of about 1 to 8 carbon atoms; an unsubstituted phenyl group or a phenyl group substituted by a lower alkyl or alkoxy or about 1 to 4 carbon atoms.

It is more preferred, however, that $R_{a1}$, $R_{a2}$ and $R_b$ be hydrogen or lower alkyl groups having from about 1 to 4 carbon atoms such as methyl, ethyl, n-propyl, isopropyl, n-butyl, sec-butyl and tert-butyl groups.

However, larger alkyl groups such as those in the range of 8 to 12 carbon atoms are specifically contemplated as being equivalent to the described alkyl groups of the present invention. Moreover, cycloalkyl, alkenyl and cycloalkenyl groups having between 1 and 12 carbon atoms are specifically contemplated as being equivalent to the described substituent alkyl groups of the present invention.

By the above method of the present invention it is possible to obtain vinyl isocyanides which correspond to those which, in theory, could be obtained by using ketones as the carbonyl compounds in the method of Schollköpf. However, the use of ketones as carbonyl compound starting materials in the Schollköpf method often give rise to competitive elimination reactions which significantly affect the yield of vinyl isocyanide product. By the method of the present invention, it is possible to avoid this drawback.

The preparation of the vinyl isocyanide compounds by the method of the present invention will now be further illustrated by certain examples and references which are provided for purposes of illustration only and are not intended to limit the present invention.

EXAMPLE 6

(i) Preparation of β-Methallyl formamide

Amounts Used
20.473 g β-methallylamine (288 mmol)
21.261 g ethyl formate (327 mmol)

The above constituents are refluxed for 5 hours. The heat is discontinued and stirring is conducted under $N_2$.

The excess ethyl formate and EtOH (ethyl alcohol by-product) are distilled off at ambient pressure. Then the product is distilled under vacuum B.P.$_{1.0}$ mm = 84°–85° C.

Yield 25.236 g (255 mmol) 88.5%

(ii) Preparation of β-methallyl isocyanide

Amounts used
25.147 g β-methallyl formamide (253 mmol)
65.0 g tosyl chloride (341 mmol)
125 g quinoline (978 mmol)

The tosyl chloride and quinoline are combined in a 500 ml 2-neck round bottom flask fitted with a greased-joint β-methallyl formamide filled dropping funnel and an outlet. The vessel is first filled with $N_2$ and placed in an oil bath heated to 75° C. The pressure is reduced and the formamide dropped in over about 15 minutes. The effluents are allowed to pass through the reaction vessel outlet and through a −78° C. trap, where the product is collected. This liquid is redistilled to yield β-methallyl isocyanide. B.P. = 128° C.–130° C. Yield = 8.648 g (107 mmol) 44.3%.

(iii) Preparation of the vinyl isocyanide

Amounts Used
8.148 g of β-methallylisocyanide (100 mmol)
0.141 g of $Cu_2O$ (0.985 mmol)

To neat β-methallyl isocyanide, which is stirring under $N_2$, is added cuprous oxide. After about 5 seconds, the reaction mixture turns dark and effervesces in a slow but steady fashion. The reaction apparatus became warm.

The reaction mixture is allowed to stir for about 4 hours. Then the mixture is distilled. B.P. = 118°–120° C. Yield = 6.984 g (86.0 mmol) = 86.0%.

As indicated above, this method of vinyl isocyanide production is quite advantageous as it provides a method by which certain vinyl isocyanide compounds can be made without the occurrence of competitive elimination reactions to a significant extent.

While cuprous oxide is the cuprous catalyst of choice, other cuprous compounds such as the cuprous halides, CuCl and CuBr, may also be used according to the present invention.

The vinyl isocyanides prepared are identifiable by their infrared spectra and their proton and carbon-13 n.m.r. spectra.

According to this aspect of the present invention are disclosed vinyl isocyanides of the formula:

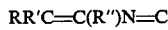

wherein R and R', which are the same or different, are each hydrogen, a $C_1$–$C_8$ alkyl group or a $C_3$–$C_7$ cycloalkyl group which is unsubstituted or substituted by lower alkyl or alkoxy groups; a $C_1$–$C_8$ alkenyl group or a $C_5$–$C_7$ cycloalkenyl group which is unsubstituted or substituted by lower alkyl or alkoxy groups; a phenyl group or naphthyl group which is unsubstituted or substituted by lower alkyl or alkoxy groups; with the proviso that at least one of R or R' be a substituent other than hydrogen; and R" is hydrogen.

It is noted that by lower alkyl is meant $C_1$-$C_4$ alkyl radicals such as methyl, ethyl, n-propyl, isopropyl, n-butyl, sec-butyl and tert-butyl. By lower alkoxy is meant $C_1$-$C_4$ alkoxy radicals such as methoxy, ethoxy, n-propoxy, isopropoxy, n-butoxy, sec-butoxy and tert-butoxy.

The vinyl isocyanides of the present invention are also easily characterized by correct C, H and N analyses. For example, vinyl isocyanides 1 and 2 and 4 are are easily characterized by correct C, H and N analyses on their crystalline cis-$(RNC)_2Mo(CO)_4$ complexes obtained by reactions of the isocyanides with the norbornadiene complex $C_7H_8Mo(CO)_4$ in hexane at room temperature, using the well-known procedure of King, R. B. "Organometallic Synthesis: Volume 1, Transition Metal Compounds," Academic Press, N.Y., N.Y. (1965) p. 124.

For example, the crystalline vinyl isocyanide 3 is easily characterized by correct C, H, and N analyses on a vacuum sublimed sample.

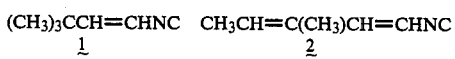

As indicated above, this method of vinyl isocyanide production is quite advantageous as it provides a method by which certain vinyl isocyanide compounds can be made without the occurrence of competitive elimination reactions which might otherwise preclude their formation.

Once the vinyl isocyanide monomer compounds are obtained, the monomers may be either homopolymerized to form a poly(vinyliminomethylene) homopolymer, or they may also be copolymerized with another isocyanide monomer to form a poly(vinyliminomethylene) copolymer. Of course, the vinyl isocyanide monomer may be polymerized with two other polymerizable monomers to form a terpolymer.

It has been found that the homopolymers of the present invention generally yield soluble polymers having measured weight-average molecular weights in the range of about 2,000 to 400,000, more preferably in the range of about 10,000 to 80,000 as determined by gel permeation chromatography. The homopolymers of the present invention generally have a polydispersivity (Mw/Mn) in the range of 1.7 to 2.4, although polydispersivities as high as 3.9 have been observed.

Nickel (II) derivatives have been found to be effective catalysts for both the homopolymerization and copolymerization reactions. While any of the known nickel (II) derivatives can be used, it is preferred that the nickel (II) derivative be $NiCl_2$; $Ni(acac)_2$, where (acac) represents acetylacetonate; $NiCl_2.6H_2O$; and $Ni(dpm)_2$, where (dpm) represents dipivaloylmethide. While the nickel (II) derivative catalyst may be employed in the amount of about 0.05 to 2.0 mole % relative to the amount of the isocyanide starting material employed, it is preferred that about 0.5 to 1.25 mole % of the catalyst be used. However, it is most preferred if about 1 mole % of the nickel (II) catalyst is used relative to the isocyanide. However, in polymerizing the vinyl isocyanide compound, along or with another isocyanide monomer, it is preferred that the monomer or monomers be added to the catalyst. That is, the catalyst is added first to the reaction vessel.

The use of $Co(acac)_2$ rather than $Ni(acac)_2$ under otherwise identical conditions gives a polymer of higher molecular weight but a much lower yield of polymer. In general, it appears that $Co(acac)_2$ is a less active catalyst than $Ni(acac)_2$.

In addition to the use of $Ni(dpm)_2$ and $Ni(acac)_2$ as catalysts, it also appears possible to use an optically active nickel (II) complex catalyst to preferentially form either left-handed or right-handed poly(vinyliminomethylene) helices from an achiral vinyl isocyanide monomer. One particularly useful catalyst in this regard might be an optically active nickel (II) complex from a chiral β-diketone derived from camphor having the formula:

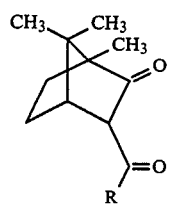

wherein R is $(CH_3)_3C-$ or $C_3F_7$. Such a chiral catalyst would be expected to be used in synthesizing chiral polymers for use as catalyst supports in asymmetric synthesis. This would provide a very useful synthesis of chiral polymers requiring only catalytic amounts of the optically active reagent.

The above-described homopolymers and the preparation thereof will now be further illustrated by certain examples and references which are provided for purposes of illustration only and are not intended to limit the present invention.

EXAMPLE 7

Homopolymerization of $(CH_3)_2C=CH-NC$ using $Ni(dpm)_2$ as a catalyst.

0.0434 g of $Ni(dpm)_2$ (0.102 mmol) is dissolved in hexane at 0° C. to form a 0.00510M solution in the hexane. Then, 1.718 g of $(CH_3)_2C=CH-NC$ (21.2 mmol) is dissolved in 20.0 ml of hexane at 0° C. to form a 1.06M solution in hexane. (Thus, the catalyst is added first, then the isocyanide). The hexane is stirred and maintained at 0° C. during addition and that temperature is maintained overnight during reaction. However, it was noted that a precipitate began to form after about 20 seconds and remained in suspension.

After overnight reaction, the reaction mixture is washed with EtOH and filtered. The solid is dissolved in $CHCl_3$ and filtered. The amber solution is reduced in volume. EtOH is added causing a dark yellow precipitate to form. This solid is filtered and suction-dried.

It is noted that, where possible, all procedures were performed at 0° C.

A yield of 1.456 g (84.7%) of polymer product was obtained.

EXAMPLE 8

Homopolymerization of $(CH_3)_2C=CH-NC$ using $Ni(acac)_2$ as a catalyst.

0.0201 g of Ni(acac)$_2$ (0.102 mmol) is dissolved in EtOH to form a 0.00508M solution in the EtOH. Then, 1.657 g of (CH$_3$)$_2$C=CH—NC (20.4 mmol) is dissolved in 20.0 ml of EtOH at 0° C. to form a 1.02M solution in the EtOH. The EtOH is stirred and maintained at 0° C. during addition and that temperature is maintained overnight during reaction. However, it was noted that a precipitate began to form after about 30 seconds and a thick orange-yellow gel formed after about 5 minutes.

After overnight reaction, the reaction mixture is washed with EtOH and filtered. The amber solution is reduced in volume. EtOH is added causing a dark yellow precipitate to form. This solid is filtered and suction-dried.

It is noted, again, that where possible, all procedures were performed at 0° C.

A yield of 1.032 g (62.3%) of polymer product was obtained.

EXAMPLES 9-23

Various vinyl isocyanide monomers were homopolymerized along the lines of Examples 7 and 8 using various nickel (II) catalysts. The poly(vinyliminomethylene) homopolymers were characterized upon isolation to obtain the molecular weight (Mw) and polydispersivity (Mw/Mn). The results obtained are summarized below in Table 1.

TABLE 1
POLYMERIZATION OF VINYL ISOCYANIDES TO POLY(VINYLIMINOMETHYLENES) USING NICKEL (II) CATALYSTS

| No. | Vinyl Isocyanide Monomer | Catalyst[a] | Yield, % | Mw | $M_w/M_n$ | $[\eta]$[b] |
|---|---|---|---|---|---|---|
| 9 | (CH$_3$)$_3$CCH=CHNC | NiCl$_2$ | 43 | 71,300 | 1.82 | 0.31 |
| 10 | (CH$_3$)$_3$CCH=CHNC | Ni(acac)$_2$ | 48 | 51,200 | 1.91 | 0.26 |
| 11 | C$_6$H$_5$CH=CHNC | NiCl$_2$ | 60 | 14,000 | 1.79 | 0.098 |
| 12 | C$_6$H$_5$CH=CHNC | Ni(acac)$_2$ | 55 | 11,000 | 1.72 | 0.095 |
| 13 | 2,4,6-(CH$_3$)$_3$C$_6$H$_2$CH=CHNC | NiCl$_2$ | 83 | insoluble | | |
| 14 | 2,4,6-(CH$_3$)$_3$C$_6$H$_2$CH=CHNC | Ni(acac)$_2$ | 90 | insoluble | | |
| 15 | C$_6$H$_5$C(CH$_3$)CH=CHNC | NiCl$_2$ | 37 | 42,800 | 2.30 | 0.28 |
| 16 | C$_6$H$_5$C(CH$_3$)CH=CHNC | NiCl$_2$ | 25 | 74,500 | 2.39 | 0.46 |
| 17 | C$_6$H$_5$C(CH$_3$)CH=CHNC | NiCl$_2$.6H$_2$O | 21 | 46,300 | 2.15 | 0.27 |
| 18 | C$_6$H$_5$C(CH$_3$)CH=CHNC | NiCl$_2$.6H$_2$O | 29 | 58,700 | 2.32 | 0.35 |
| 19 | C$_6$H$_5$C(CH$_3$)CH=CHNC | Ni(acac)$_2$ | 28 | 40,200 | 2.22 | 0.22 |
| 20 | C$_6$H$_5$C(CH$_3$)CH=CHNC | Ni(acac)$_2$ | 30 | 63,300 | 1.98 | 0.36 |
| 21 | CH$_3$CH=C(CH$_3$)CH=CHNC | NiCl$_2$ | 97 | insoluble | | |
| 22 | CH$_3$CH=C(CH$_3$)CH=CHNC | NiCl$_2$.6H$_2$O | 100 | insoluble | | |
| 23 | CH$_3$CH=C(CH$_3$)CH=CHNC | Ni(acac)$_2$ | 99 | insoluble | | |

[a] In all of these experiments about 1 mole % of the nickel (II) catalyst was used relative to the isocyanide.
[b] Inherent Viscosity

EXAMPLES 24-33

The particular vinyl isocyanide, (CH$_3$)$_3$C—CH=CH—NC, was prepared from pivalaldehyde and methyl isocyanide in 76% yield using the mthod of Schollkopf as described above. The homopolymerization of (CH$_3$)$_3$C—CH=CH—NC was then investigated under a variety of conditions. The results of these investigations with the recited conditions for each example are listed in Table 2.

TABLE 2
POLYMERIZATIONS OF (CH$_3$)$_3$C—CH=CH—NC

| Example No. | Catalyst | Solvent | Temp[a] | Yield | Mw[b] | $M_w/M_n$[b] | Analyses, %[c] C | H | N |
|---|---|---|---|---|---|---|---|---|---|
| 24 | Ni(acac)$_2$, 0.088% | EtOH | R.T. | 52% | 165,000 | 1.8 | 75.5 | 10.2 | 12.6 |
| 25 | Ni(acac)$_2$, 0.20% | EtOH | R.T. | 58% | 144,000 | 1.8 | 76.2 | 10.3 | 12.7 |
| 26 | Ni(acac)$_2$, 0.47% | EtOH | R.T. | 58% | 144,000 | 1.9 | 76.7 | 10.3 | 12.7 |
| 27 | Ni(acac)$_2$, 0.95% | EtOH | R.T. | 48% | 51,000 | 1.9 | 75.1 | 10.1 | 12.5 |
| 28 | Ni(acac)$_2$, 0.94% | EtOH | R.T. | 20% | 145,000 | 1.8 | 74.2 | 10.2 | 12.7 |
| 29 | Ni(acac)$_2$, 0.51% | EtOH | 40° C. | 57% | 150,000 | 1.9 | 76.9 | 10.2 | 12.8 |
| 30 | Ni(acac)$_2$, 0.48% | EtOH | 0° C. | 62% | 270,000 | 1.9 | 76.8 | 10.2 | 12.8 |
| 31 | Ni(acac)$_2$, 0.48% | EtOH | −780C T R.T.[d] | 63% | 400,000 | 3.9 | 76.8 | 10.2 | 12.8 |
| 32 | Ni(dpm)$_2$, 0.50% | EtOH | R.T. | 69% | 97,000 | 2.0 | 76.7 | 10.2 | 12.8 |
| 33 | Ni(dpm)$_2$, 0.48% | EtOH | R.T. | 73% | 192,000 | 2.3 | 76.8 | 10.2 | 12.8 |

[a] R.T. = room temperature (25° C.).
[b] Data obtained using gel permeation chromatography.
[c] Calculated for [(CH$_3$)$_3$CCH=CHNC]$_n$: C, 77.0; H, 10.2; N, 12.8.
[d] Polymerization appeared to begin when the temperature of the reaction reached −16° C.

According to yet another aspect of the present invention, it has been found that the copolymerization of an isocyanide yielding an insoluble homopolymer upon polymerization with a second isocyanide, which yields a soluble homopolymer (i.e., soluble in a non-reactive organic solvent) upon polymerization, often results in a soluble copolymer containing pendant groups arising from both isocyanides. In such copolymers, the presence of pendant groups from each of the isocyanide comonomers is indicated by the C-13 NMR spectra thereof. Moreover, elemental analysis for carbon, hydrogen and nitrogen can be used to determine the ratio of these pendant groups.

For example, while the homopolymers of the vinyl isocyanides are generally soluble in solvents such as chloroform, it has been found that the homopolymerization of 2,4,6-(CH$_3$)$_3$C$_6$H$_2$CH=CHNC and of the dienyl isocyanide CH$_3$CH=C(CH$_3$)CH=CHNC yields insoluble polymers when using the usual nickel (II) catalysts. However, quite surprisingly, it has been found that the copolymerization of these compounds, such as 2,4,6-(CH$_3$)$_3$C$_6$H$_2$CH=CHNC, with an approximately equimolar amount of an isocyanide compound having the isocyanide group attached to a sterically hindered carbon, such as a tertiary carbon, as in tert-butyl isocyanide, yields a soluble copolymer. It appears that in copolymerizing either of the above two monomers with another isocyanide monomer, it is necessary that the latter compound have the isocyanide group attached to a sterically hindered carbon in order that the formed copolymer be soluble. By approximately equimolar amount is meant about 75 to 125 molar % of the one isocyanide monomer relative to the other.

For example, it has been found that the copolymerization of 2,4,6-(CH$_3$)$_3$C$_6$H$_2$CH=CHNC with an equimolar amount of tert-butyl isocyanide using a nickel (II) acetylacetonate catalyst gave a soluble polymer suggested by elemental analysis of C,H and N to consist of about 95% of 2,4,6-(CH$_3$)$_3$C$_6$H$_2$CH=CHNC units. Apparently, the role of the sterically hindered tertiary carbon bearing isocyanide is to inhibit the chain growth of the 2,4,6-(CH$_3$)$_3$C$_6$H$_2$CH=CHNC polymerization so that the degree of polymerizaton is prevented from being so high that the polymer is insoluble.

Thus, in instances where a particular isocyanide monomer does not, upon homopolymerization, result in the production of a soluble poly(iminomethylene), a soluble poly(iminomethylene) copolymer may be obtained by copolymerizing the isocyanide monomer yielding an insoluble homopolymer with an isocyanide having the isocyanide functionality attached to a sterically hindered carbon. Preferential examples of tertiary carbon bearing compounds which may be used are tert-butyl isocyanide, tert-pentyl isocyanide and tert-hexyl isocyanide. Those are isocyanides bearing tert-butyl, tert-pentyl and tert-hexyl radicals. However, most preferred is tert-butyl isocyanide. Nevertheles, any tri-alkyl or tri-aryl-substituted methyl isocyanide may be used. However, it is preferred if the tri-alkyl-substituted methyl isocyanides have 1 to 6 carbon atoms per alkyl group, while the tri-aryl groups have about 6 to 12 carbon atoms per aryl group.

However, other sterically hindered isocyanides may be used such as those bearing secondary carbons attached directly to the isocyanide nitrogen and which are sterically hindered. For example, R groups, for RNC, which may be used to render the isocyanide sterically hindered are

alkyl, where Ph is a phenyl group which may be unsubstituted or substituted by lower alkyl and lower alkoxy groups of 1 to 6 carbon atoms; and alkyl in the formula designates lower alkyl groups of 1 to 6 carbon atoms. For example, the group

Me, where Me is methyl may be used.

Of course, it is also possible to use R groups such as

where, as above, Ph is a phenyl group which may be unsubstituted or substituted by lower alkyl and lower alkoxy groups of 1 to 6 carbon atoms.

It is also possible to use the vinylogous sterically hindered group, X—CH=CH—, wherein X is defined as groups such as tert-butyl, tert-pentyl, tert-hexyl groups or the groups

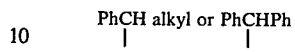

as described above.

Generally, X may be also be a radical of the formula:

wherein Ar is an unsubstituted aryl group or aryl group substituted by one or more lower alkyl or alkoxy groups with a total of 6 to 12 carbon atoms, and wherein Alkyl is an alkyl group of 1 to about 6 carbon atoms.

Moreover, it is also possible to use dialkyl-amino groups with alkyl groups of 1 to about 8 carbon atoms, whose carbon atoms may be branched or linear. For example, the R group of RNC may be diethylamino groups.

Similarly, the various diaryl-amino groups having aryl groups of 6 to about 12 carbon atoms may be used. The aryl groups may be unsubstituted, such as phenyl, or substituted with 1 to 6 carbon atoms.

In general, when utilizing such sterically hindered isocyanide monomer, a sufficient amount is used to have about 5-95% by wt. thereof in the polymer. However, it is usually best to have between about 20-80% by wt. therein.

Table 3 summarizes some of the isocyanide copolymerizations which have been conducted. It is noted that all of these copolymerizations were performed in ethanol solutions using 0.5% nickel (II) acetylacetonate catalyst. However, the other nickel catalysts already described could also be used. Initially, copolymerizations with tert-butyl isocyanide were investigated as the homopolymer obtained from tert-butyl isocyanide is among the most soluble of the simple isocyanide homopolymers.

In order to highlight the information and examples of Table 3, the present copolymers and the preparation thereof will now be further illustrated by the following example which is provided for purposes of illustration only and is not intended to limit the present invention.

EXAMPLE 34

0.635 g. (15.5 mmoles) of methyl isocyanide, 1.263 g. (15.2 mmoles) of tert-butyl isocyanide 0.0376 g. (0.146 mmoles) of nickel (II) acetylacetonate, and 30 ml. of ethanol were stirred together at room temperature. The mixture turned amber after 5 minutes and became turbid after 1 hour. After the precipitation appeared to be complete, the precipitate was filtered and washed with ethanol. The solid was then dissolved in chloroform. Concentration of the filtered chloroform solution followed by addition of ethanol gave a precipitate which was filtered and dried overnight to give 0.253 g. (13% yield based on the total weight of isocyanide monomers used) of copolymer. The carbon-13 NMR spectrum of this copolymer is shown in FIG. 1. The presence of $CH_3N=C$ units in the copolymer backbone is indicated by the resonance at $\delta 41.9$ and the presence of $(CH_3)_3CN=C$ units in the copolymer backbone is indicated by the resonances at $\delta 58.1$ and $\delta 30.3$. Two different imino carbon resonances were observed ($\delta 169.8$ and $\delta 160.6$) indicating that approximately half of the amino carbons are bonded to methyl groups and half to tert-butyl groups. The elemental analyses (C, 68.2; H, 10.0; N, 21.8 after correcting for incomplete combustion) suggest a poly(iminomethylene) containing 44% $CH_3NC$ units and 56% $(CH_3)_3CNC$ units (Calcd. for $(CH_3NC)_{0.44}[(CH_3)_3CNC]_{0.58}$: C, 68.4; H, 9.9; N, 21.7).

($M_w$) in the range of 25,000±2,000 but relatively little of the methyl or ethyl isocyanide was incorporated into this copolymer. See Table 3. Copolymerization of cyclohexyl isocyanide with α-phenylethyl isocyanide yielded an initially soluble copolymer incorporating reasonable amounts of cyclohexyl isocyanide (Table 3), but this copolymer became insoluble upon standing. Copolymerizations of the vinyl isocyanides $CH_3CH=CHNC$ and $(CH_3)_2C=CHNC$ with α-phenylethyl isocyanide give materials in which substantial amounts of the vinyl isocyanide were incorporated.

Copolymerizations with other sterically hindered isocyanides such as tert-butylvinyl isocyanide $(CH_3)_3CCH=CHNC$, were also conducted since this

TABLE 3

COPOLYMERIZATIONS OF ISOCYANIDES[a]

| | Comonomers[b],[c] | | | Copolymer | | | | | |
|---|---|---|---|---|---|---|---|---|---|
| | | | | Solubility[e] | | Molecular Weights[f] | | | Composition[g] |
| No. | R in RNC | R' in R'NC | Yield, %[d] | EtOH | CHCl₃ | $M_w$ | $M_n$ | $M_w/M_n$ | RNC, % | R'NC, % |
| (A) Copolymers with tBuNC | | | | | | | | | | |
| 35 | Bu$^t$(50) | Me(50) | 13 | − | + | 5,100 | 1,600 | 3.2 | 56 | 44 |
| 36 | Bu$^t$(33) | Me(67) | 5 | − | + | 6,800 | 2,300 | 2.9 | 42 | 58 |
| 37 | Bu$^t$(17) | Me(83) | 58 | + | + | | | | | |
| 38 | Bu$^t$(9) | Me(91) | 8 | + | + | | | | | |
| 39 | Bu$^t$(50) | Et(50) | 31 | − | + | 5,500 | 1,900 | 2.9 | 45 | 55 |
| 40 | Bu$^t$(50) | Cx(50) | 51 | − | − | | | | | |
| 41 | Bu$^t$(80) | Cx(20) | 21 | − | − | | | | | |
| 42 | Bu$^t$(50) | Vi(50) | 30 | + | + | | | | | |
| 43 | Bu$^t$(9) | Vi(91) | 25 | + | + | | | | | |
| 44 | Bu$^t$(50) | MeCH=CH(50) | 28 | − | + | 2,200 | 580 | 3.9 | 25 | 75 |
| 45 | Bu$^t$(10) | MeCH=CH(90) | 68 | − | − | | | | | |
| 46 | Bu$^t$(50) | Me₂C=CH(50) | 22 | − | + | 1,600 | 660 | 2.5 | <5 | >95 |
| 47 | Bu$^t$(50) | MesCH=CH(50) | 17 | − | + | 59,000 | 19,000 | 3.2 | 8 | 92 |
| 48 | Bu$^t$(50) | Et₂N(50) | 51 | + | + | | | | | |
| (B) Copolymers with PhCHMe | | | | | | | | | | |
| 48 | PhCHMe(50) | Me(50) | 58 | − | + | 23,000 | 9,000 | 2.6 | 90 | 10 |
| 49 | PhCHMe(50) | Et(50) | 49 | − | + | 27,000 | 10,400 | 2.6 | 87 | 13 |
| 50 | PhCHMe(50) | Cx(50) | 87 | − | +[h] | | | | 58 | 42 |
| 51 | PhCHMe(50) | Vi(50) | 21 | − | + | 10,600 | 5,200 | 2.0 | 90 | 10 |
| 52 | PhCHMe(50) | MeCH=CH(50) | 56 | − | + | 5,600 | 2,400 | 2.3 | 45 | 55 |
| 53 | PhCHMe(50) | Me₂C=CH(50) | 70 | − | + | 12,000 | 4,800 | 2.5 | 45 | 55 |
| (C) Copolymers with tBuCH=CHNC | | | | | | | | | | |
| 54 | tBuCH=CH(50) | Me(50) | 31 | − | + | 43,000 | 17,000 | 2.5 | 87 | 13 |
| 55 | tBuCH=CH(50) | Et(50) | 37 | − | +[h] | | | | 50 | 50 |
| 56 | tBuCH=CH(50) | Cx(50) | 19 | − | + | 72,000 | 36,000 | 2.0 | i | i |
| 57 | tBuCH=CH(50) | Vi(50) | 47 | − | − | | | | | |
| 58 | tBuCH=CH(50) | MesCH=CH(50) | 57 | − | + | 44,000 | 19,000 | 2.4 | 30 | 70 |
| (D) Other Copolymers | | | | | | | | | | |
| 59 | Me(50) | Vi(50) | 40 | − | − | | | | | |
| 60 | Me(50) | Et₂N(50) | 62 | + | + | | | | | |
| 61 | Vi(50) | Cx(50) | 29 | − | − | | | | | |

[a]All of the listed copolymerizations were run in ethanol solution using 0.5 mole % of nickel (II) acetylacetonate relative to the total isocyanides. The ethanol-insolubles polymers precipitated. They were washed with ethanol. The chloroform-soluble polymers were purified by dissolving in chloroform, concentrating the filtered chloroform solution in vacuum, and then precipitation with excess ethanol.
[b]Me—methyl, Et—ethyl, Vi = vinyl, Cx = cyclohexyl, Bu$^t$ = tert-butyl, Mes = 2,4,6-trimethylphenyl (mesityl).
[c]The mole percentages of each comonomer used are given in parentheses.
[d]Yields are given relative to the total isocyanide comonomers introduced.
[e](+) means soluble and (−) means insoluble in ethanol and chloroform.
[f]The molecular weights were determined by gel permeation chromatography using polystyrene as a standard.
[g]The compositions of the copolymers were determined from analytical data from carbon, hydrogen, and nitrogen corrected to % C + % H + % N = 100%. The analytic results were consistent with the carbon-13 NMR spectra which were run in CDCl₃.
[h]These copolymers were soluble in chloroform when freshly prepared but became partially insoluble upon standing so that molecular weight determinations were not feasible.
[i]Analytical data could not be used to determine the composition of this copolymer since t-BuCH=CHNC and C × NC have the same elemental composition (C₇H₁₁N). The incorporation of appreciable amounts of cyclohexyl isocyanide into this copolymer is indicated by a broad resonance at w26.0 in its carbon-13 NMR spectrum in addition to resonances attributable to t-BuCH=CHNC units.

In view of the relatively low molecular weights of the copolymers with tert-butyl isocyanide, copolymerizations with other sterically hindered isocyanides such as α-phenylethyl isocyanide, $C_6H_5CH(CH_3)NC$, were conducted since the homopolymer from α-phenylethyl isocyanide, while soluble in chloroform, has a much higher molecular weight than the homopolymer from tert-butyl isocyanide. Copolymerizations of methyl and ethyl isocyanides with α-phenylethyl isocyanide gave chloroform-soluble polymers with molecular weights vinyl isocyanide has been found to give soluble homopolymers having molecular weights in the range of about 50,000 to 400,000 depending upon the polymerization conditions. Of particular interest is the soluble copolymer of cyclohexyl isocyanide with $(CH_3)_3CCH=CHNC$ shown to have a molecular weight ($M_w$) of about 72,000 and to contain some cyclohexyl isocyanide units by a broad resonance at $\delta 26.0$ in its carbon-13 NMR spectrum (Table 3). Determination of the composition of this copolymer by elemental analysis is impossible since tert-butylvinyl and cyclohexyl isocyanides are $C_7H_{11}N$ isomers. Inspection of Table 3 shows the formation of polymers incorporating 44 to 58% of methyl or ethyl isocyanide units (Table 1) which had molecular weights ($M_w$) in the range of about 5,000–7,000 and which were soluble in chloroform but insoluble in ethanol. Attempted copolymerization of cyclohexyl isocyanide with tert-butyl isocyanide gave only an insoluble polymer similar to the homopolymer obtained from cyclohexyl isocyanide alone. Attempted copolymerization of vinyl isocyanide and of diethylaminoisocyanide with tert-butyl isocyanide failed to precipitate any polymer from the ethanolic polymerization solution and only low molecular weight non-polymeric materials were isolated after evaporation of the ethanol. However, copolymerization of several substituted vinyl isocyanides, $CH_3CH=CHNC$, $(CH_3)_2C=CHNC$, and $2,4,6-(CH_3)_3C_6H_2CH=CHNC$, with tert-butyl isocyanide in an approximate 1:1 mole ratio gave chloroform-soluble copolymers shown by carbon-13 NMR spectroscopy and elemental analyses to contain at least 75% of the vinylic isocyanide unit in the poly(iminomethylene) backbone.

Thus, according to the present invention, it is now possible to incorporate isocyanides, which themselves form insoluble homopolymers, into soluble poly(iminomethylenes) through copolymerization with a second isocyanide. By judicious selection of the monomer units, it is possible to achieve an optimum combination of solubility properties, molecular structure and molecular weight.

With respect to the copolymers of the present invention, copolymerizations with tert-butyl isocyanide appear to be generally quite useful, although the resulting polymers have relatively low molecular weights. Soluble copolymers having higher molecular weights can often be obtained through copolymerization with $C_6H_5CH(CH_3)NC$ or $(CH_3)_3CCH=CHNC$ but incorporation of other isocyanide units into these polymer backbones in reasonable amounts is usually difficult. Substituted vinyl isocyanides such as $CH_3CH=CHNC$, $(CH_3)_2C=CHNC$, and $2,4,6-(CH_3)_3C_6H_2CH=CHNC$ which give insoluble homopolymers are most readily incorporated into soluble copolymers using the methods and compositions of the present invention. This observation suggests that vinyl isocyanides polymerize more rapidly with nickel (II) catalysts than isocyanides in which the isocyano group is bonded to an $sp^3$ carbon atom.

Generally, the copolymers of the present invention utilizing tertiary carbon bearing isocyanides such as tert-butyl isocyanide as one of the starting monomers being sterically hindered have a weight-average molecular weight (Mw) in the range of about 1,000 to about 70,000, and a number-average molecular weight (Mn) in the range of about 500 to 25,000. These copolymers have a polydispersivity (Mw/Mn) in the range of about 2.0 to 4.0.

The copolymers of the present invention utilizing sterically hindered secondary carbon bearing isocyanides such as those where R of RNC is of the

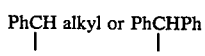

series have a Mw in the range of about 5,000 to about 35,000, and a Mn in the range of about 1,000 to about 15,000. These copolymers have a polydispersivity in the range of about 2.0 to 3.0.

The copolymers of the present invention utilizing sterically hindered vinylogous isocyanides, such as those where R of RNC is t-BuCH=CH— have a Mw in the range of about 40,000 to about 80,000, and a Mn in the range of about 15,000 to about 40,000. These copolymers have a polydispersivity in the range of about 2.0 to 3.0.

As already noted, the copolymers of the present invention now make it possible to incorporate into poly(iminomethylene) polymers a much wider variety of pendant functional groups than was previously possible. For example, as equivalent to the groups already described, it is now possible to incorporate in the polymers, pendant functional groups such as alcohol, ester, alkoxy, phosphino groups or even heterocyclic groups such as imidazole groups. These, of course, are in addition to the various hydrocarbon groups already mentioned. In short, any functional group can be incorporated into the polymers provided that such group does not greatly prejudice the polymerization reaction.

With respect to the various solvents which can be used for the polymerization reactions, lower alkyl alcohols such as ethanol have already been mentioned as have chlorinated hydrocarbons such as chloroform. However, other such solvents may be used such as isopropyl alcohol, n-butyl alcohol or dichloromethane. Further, other types of relatively polar solvents may also be used such as ketones such as acetone.

As already noted, the homopolymers and copolymers of the present invention are used advantageously in the formation of highly conjugated conducting materials. As such the polymers of the present invention may be used in manufactured articles where electroconductivity is required in the manner provided by U.S. Pat. No. 4,304,987 which is specifically incorporated herein by reference in its entirety. Moreover, it is also possible to add various metals and salts thereof to the polymer compositions for enhancing conductivity in the manner provided by U.S. Pat. Nos. 3,867,315 and 3,978,378, which are specifically incorporated herein by reference in their entirety.

Additionally, the polymers of the present invention may be used advantageously in the preparation of printed circuits in the manner provided by U.S. Pat. No. 4,371,459 which is specifically incorporated herein by reference in its entirety.

Along these lines, the conductive polymers of the present invention may be fabricated, particularly into thin layered capacitors or printed circuits, with the conductive material being coextruded with dielectric materials using the coextrusion apparatus of U.S. Pat. No. 3,557,265 which is incorporated by reference herein in its entirety.

Furthermore, by using the copolymers of the present invention, it is now possible to greatly increase the range of functional groups that can be incorporated into poly(iminomethylenes) having the desired solubility and molecular weight properties. Accordingly, these copolymers increase the range of applications for these materials as chiral supports for asymmetric catalysts and for the preparation of novel conducting materials.

Having now fully described this invention, it will be apparent to one of ordinary skill in the art that many changes and modifications can be made thereto without departing from the spirit or scope of the invention as set forth herein.

What is claimed as new and desired to be secured by Letters Patent of the United States is:

1. A poly(vinyliminomethylene) copolymer having:
   (a) at least one recurring structural unit of the formula:

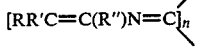

wherein R and R', which are the same or different, are each hydrogen, a $C_1$-$C_8$ alkyl group or $C_3$-$C_7$ cycloalkyl goup which alkyl or cycloalkyl groups are unsubstituted or substituted by lower alkyl or alkoxy groups or which contain up to four non-catenated oxygen atoms, a $C_2$-$C_8$ alkenyl group or a $C_5$-$C_7$ cycloalkenyl group which is unsubstituted or substituted by lower alkyl or alkoxy groups, a phenyl group or naphthyl group which is unsubstituted or substituted by lower alkyl or alkoxy groups, with the proviso that at least one of R and R' be a substituent other than hydrogen; and R" is hydrogen; and
   (b) at least one other isocyanide structural unit derived from an isocyanide monomer copolymerizable therewith, and n in the above formula has a value such that the weight-average molecular weight of the copolymer is in the range of about 2,000 to 400,000 as determined by gel permeation chromatography.

2. A poly(vinyliminomethylene) copolymer of claim 1, wherein either R or R' or both are a $C_1$-$C_8$ straight-chain or branched-chain alkyl group which is unsubstituted or substituted by lower alkoxy groups or which contain up to four non-catenated oxygen atoms.

3. A poly(vinyliminomethylene) copolymer of claim 1, wherein either R or R' or both are a methyl, ethyl, n-propyl, isopropyl, n-butyl, sec-butyl or tert-butyl group.

4. A poly(vinyliminomethylene) copolymer comprising at least two different recurring isocyanide-derived structural units, comprising:
   (a) at least one recurring isocyanide structural unit derived from a sterically hindered isocyanide-derived of the formula:

X—CH=CH—N≡C wherein X is selected from the group of tert-butyl, tert-pentyl, tert-hexyl, and radicals of the formula:

Ar—CH—
   |
   Alkyl wherein Ar is an unsubstituted aryl group or aryl group substituted by one or more lower alkyl or alkoxy groups with a total of 6-12 carbon atoms, and wherein Alkyl is an alkyl group of 1 to about 6 carbon atoms; and
   (b) at least one other recurring isocyanide structural unit derived from an isocyanide monomer copolymerizable therewith.

5. A poly(vinyliminomethylene) copolymer of claim 4, wherein said sterically hindered isocyanide comprises from about 5% to about 95% by weight of the total copolymer weight.

6. A poly(vinyliminomethylene) copolymer of claim 5, wherein said sterically hindered isocyanide comprises from about 20% to about 80% by weight of the total copolymer weight.

7. The copolymer of claim 4, wherein said isocyanide monomer copolymerizable therewith is an isocyanide monomer the homopolymer of which is substantially insoluble in chloroform.

8. The copolymer of claim 4, wherein said isocyanide monomer copolymerizable therewith is selected from the group consisting of 2,4,6-$(CH_3)C_6H_2CH$=CHNC, $CH_3CH$=$C(CH_3)CH$=CHNC,

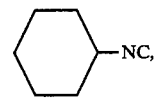

$CH_3CH$=CHNC, and $(CH_3)_2C$=CHNC.

9. A copolymer of claim 4, wherein said sterically hindered isocyanide is $(CH_3)_3CCH$=CHNC and said other isocyanide monomer copolymerizable therewith is

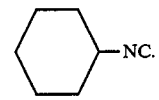

10. A copolymer having at least two different recurring isocyanide structural units, comprising:
    (a) at least one recurring sterically hindered isocyanide structural unit derived from an isocyanide monomer selected from the group consisting of a trialkyl-substituted methyl isocyanide having 1-6 carbon atoms per alkyl group and a tri-aryl-substituted methyl isocyanide having 6-12 carbon atoms per aryl group, and
    (b) at least one other isocyanide structural unit derived from an isocyanide monomer copolymerizable therewith, and wherein said copolymer has a weight-average molecular weight in the range of about 1,000 to 70,000 as determined by gel permeation chromatography.

11. A copolymer of claim 10, wherein said sterically hindered isocyanide monomer is selected from the group consisting of tert-butyl isocyanide, tert-pentyl isocyanide and tert-hexyl isocyanide.

12. A poly(vinyliminomethylene) copolymer having:
    (a) at least one recurring structural unit of the formula:

wherein R and R', which are the same or different, are each hydrogen, a $C_1$-$C_8$ alkyl group or a $C_3$-$C_7$ cycloalkyl group which alkyl or cycloalkyl groups are unsubstituted or substituted by lower alkyl or alkoxy groups or which contain up to four non-catenated oxygen atoms, a $C_2$-$C_8$ alkenyl group or a $C_5$-$C_7$ cycloalkenyl group which is unsubstituted or substituted by lower alkyl or alkoxy groups, a phenyl group or a naphthyl group which is unsubstituted or substituted by lower alkyl or alkoxy groups, with the proviso that at least one of R and R' be a substituent other than hydrogen; and R" is hydrogen; and (b) at least one other structural unit derived from a monomer copolymerizable therewith, and wherein n in the above formula has a value such that the weight-average molecular weight of the copolymer is in the range of about 2,000 to 400,000 as determined by gel permeation chromatography.

13. A copolymer having at least two different recurring isocyanide structural units, comprising:

(a) at least one recurring sterically hindered isocyanide structural unit derived from an isocyanide monomer unit of the formula:

R—NC wherein R represents a

Ph—CH—alkyl
| group or a

Ph—CH—Ph
| group, wherein Ph is a phenyl group which is unsubstituted or substituted by a lower alkyl and lower alkoxy groups of 1–6 carbon atoms, and alkyl in the formula representing R is a lower alkyl group of 1–6 carbon atoms; and (b) at least one other isocyanide structural unit derived from an isocyanide monomer copolymerizable therewith, and wherein said copolymer has a weight-average molecular molecular weight in the range of about 5,000–35,000.

* * * * *